(12) United States Patent
Kobrin

(10) Patent No.: US 8,318,386 B2
(45) Date of Patent: *Nov. 27, 2012

(54) FABRICATION OF NANOSTRUCTURED DEVICES

(75) Inventor: Boris Kobrin, Dublin, CA (US)

(73) Assignee: Rolith Inc., Pleasanton, CA (US)

(*) Notice: Subject to any disclaimer, the term of this patent is extended or adjusted under 35 U.S.C. 154(b) by 596 days.

This patent is subject to a terminal disclaimer.

(21) Appl. No.: 12/462,625

(22) Filed: Aug. 6, 2009

(65) Prior Publication Data

US 2010/0035163 A1 Feb. 11, 2010

Related U.S. Application Data

(63) Continuation-in-part of application No. PCT/US2008/012901, filed on Nov. 18, 2008, and a continuation-in-part of application No. 12/384,167, filed on Apr. 1, 2009, now Pat. No. 8,182,982, and a continuation-in-part of application No. 12/384,219, filed on Apr. 1, 2009, and a continuation-in-part of application No. 12/455,938, filed on Jun. 8, 2009.

(60) Provisional application No. 61/188,224, filed on Aug. 7, 2008.

(51) Int. Cl.
*G03F 7/00* (2006.01)
*H01L 21/027* (2006.01)

(52) U.S. Cl. ............ 430/2; 430/325; 430/323; 430/311; 430/320; 430/321; 430/319

(58) Field of Classification Search .................. None
See application file for complete search history.

(56) References Cited

U.S. PATENT DOCUMENTS

| 7,170,666 | B2 | 1/2007 | Piehl | |
|---|---|---|---|---|
| 2005/0202185 | A1 | 9/2005 | Greengard | |
| 2009/0269705 | A1* | 10/2009 | Kobrin | 430/322 |
| 2009/0297989 | A1* | 12/2009 | Kobrin | 430/322 |
| 2010/0123885 | A1* | 5/2010 | Kobrin | 355/53 |
| 2011/0210480 | A1* | 9/2011 | Kobrin | 264/447 |

OTHER PUBLICATIONS

D. Schaadt, Enhanced semiconductor optical absorption via surface plasmon excitation in metal nanoparticles, Appl.Phyt.Lett, 86,063106, 2005.

(Continued)

*Primary Examiner* — Cynthia Kelly
*Assistant Examiner* — Anna Verderame
(74) *Attorney, Agent, or Firm* — Joshua D. Isenberg; JDI Patent

(57) ABSTRACT

Embodiments of the invention relate to methods useful in the fabrication of nanostructured devices for optics, energy generation, displays, consumer electronics, life sciences and medicine, construction and decoration. Instead of nanostructuring using colloids of particles, special vacuum deposition methods, laser interference systems (holography), and other low-throughput limited surface area techniques, we suggest to use nanotemplate created by novel nanolithography method, "Rolling mask" lithography. This method allows fast and inexpensive fabrication of nanostructures on large areas of substrate materials in conveyor-type continuous process. Such nanotemplate is then used for selective deposition of functional materials. One of embodiments explains deposition of functional materials in the exposed and developed areas of the substrate. Another embodiment uses selective deposition of the functional material on top of such template. Alternatively, nanotemplate is deposited and patterned on functional material, and then used as an etch mask to transfer nanostructure into the functional material using dry or wet etching process.

19 Claims, 5 Drawing Sheets

OTHER PUBLICATIONS

S. Price, Addressable, large-area nanoscale organic light-emitting diodes, Small, 2007,3, No. 3, p. 372-374.

Shingeo Fujimori, Plasmonic Light Concentration in Organic Solar Cells, Accepted in Nanoletters, p. 1-17.

S. Pillai, Surface Plasmon Enhanced Silicon Solar Cells, J.Appl. Phys,101, 093105 (2007).

D. Derkacs, Improved Performance of Amorphous Silicon Solar Cells Via Scattering From Surface Plasmon Polaritons in Nearby Metallic Nanoparticles, Appl. Phys. Lett, 89, 09310.

Zhaoning Yu, Fabrication of Large Area Subwavelength Antireflection Structures on Si Using Trilayer Resist Nanoimprint Lithography and Liftoff, J.Vac.Sci.Techn B21(6), 2003.

Guoyong Xie, The Fabrication of Subwavelength Anti-Reflective Nanostructures Using a Bio-Template, Nanotechnology 19(2008) 095605, p. 1-5.

Paul Roach, Progress in Superhydrophobic Surface Development, Soft Matter,2008,4,p. 224-240.

Jing Zhao, Localized Surface Plasmon Resonance Viosensors, Nanomedicine 2006, 1(2), p. 219-228.

Peter Forbes, Self-Cleaning Materials: Lotus-Inspired Nanotechnology, Scientific American, Jul. 30, 2008.

Bruce McLeaod, Thin-Films-Motheye Surfaces Reflect Little Light, Laser Focus World, Diplay Article (36357).

Michael Berger, Moth Eyes Self-Cleaning Antireflection Nanotechnology Coatings, Nanowerk, 2008.

* cited by examiner

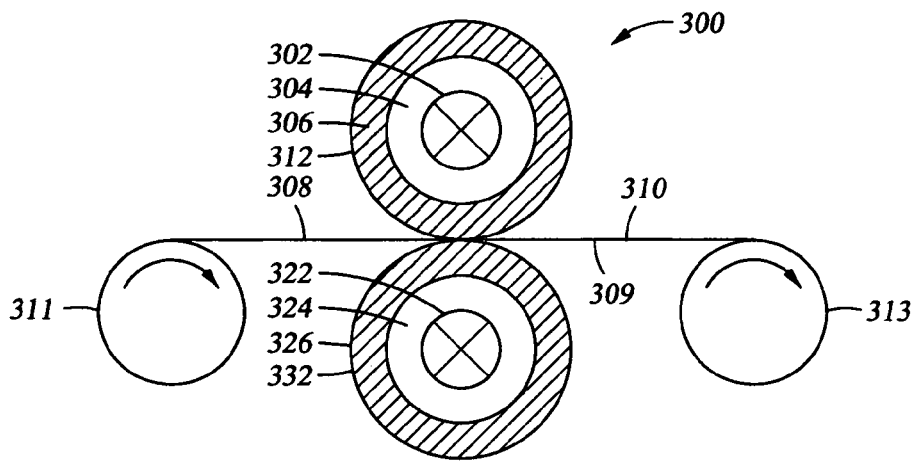
*Fig. 3*
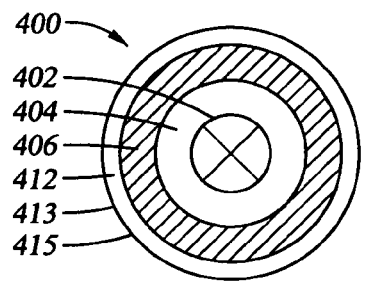 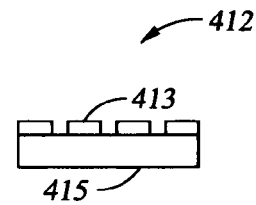
*Fig. 4A*  *Fig. 4B*
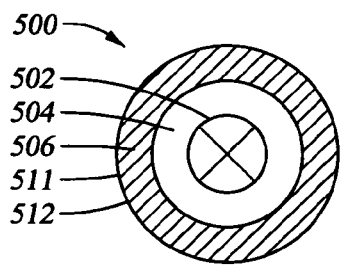 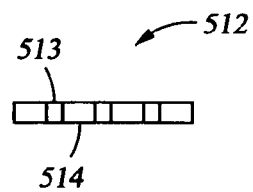 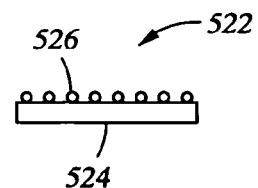
*Fig. 5A*  *Fig. 5B*  *Fig. 5C*

FABRICATION OF NANOSTRUCTURED DEVICES

This application claims the benefit of U.S. provisional Application No. 61/188,224 filed Aug. 7, 2008 and is a continuation in part of PCT/US2008/012901 filed Nov. 18, 2008 and U.S. utility application Ser. No. 12/384,167 filed Apr. 1, 2009, all of which are hereby incorporated by reference in their entirety.

FIELD

This invention relates to a new method of fabricating nanostructured devices for optics, electronics, architecture, and other industries. Nanostructered optical devices may include light absorbers for photovoltaics, light extraction layers for LEDs, nanostructured optical filters, anti-reflective and anti-glare layers, electrodes and polarizers for flat panel displays, optical nanosensors, photonics crystals, optical devices based on methamaterials, and other nanophotonic devices. Nanostructured devices may also be self-cleaning or adhesive surfaces. Nanostructured devices may also include multiple features combined on the same surface, for example, a surface may have anti-reflective and self-cleaning qualities simultaneously.

BACKGROUND

Until recently, nanostructured devices have been limited to processors, memory chips and other integrated circuits devices, which have been produced using microlithography extended in nanodimensions—nanolithography. During the last few years a variety of new fields and applications have been brought to life due to maturation of nanolithography technique and wider access to nanolithography tools and foundries. One of the most promising new fields is nanophotonics.

Nanophotonic devices exploit the unique interaction of light with deep-subwavelength nanoscale objects. This relatively new class of highly compact, high-performance optical components is readily customized and easily integrated with other optical devices and electronics and is of significant interest to both electro-optic circuit designers and manufacturers. For visible light (used for digital imaging and display applications) and near-infrared (IR) wavelengths (used for some optical storage, sensor, and communications applications), this requires a capability of creating structures with dimensions on the order of tens to a few hundreds of nanometers with accuracy of 10 nm or less.

Fabricating physical devices with such fine-scale structures in a way that can be flexibly applied to a large variety of structural shapes and substrates presents the challenge of developing nanolithography techniques that support high-fidelity pattern replication with accuracies of a single nanometer. In general, materials can be formed into nanoscale structures by either bottom-up methods (built or grown molecule by molecule) or top-down methods (by etching the pattern into a deposited material).

One very promising application is a nanostructured anti-reflective coating (referred to as "AR coating"). Traditional thin-film AR coatings can suffer catastrophic failure or delamination from high-energy or thermal-cycling applications. High-power laser applications require low-reflectivity lenses to limit high-energy retroreflection. The thermal performance of these AR-coated substrates is governed by the composite structure's ability to dissipate heat generated by the absorption of incident laser energy during transmission or reflection. This ability is directly related to the absorption that takes place in the substrate, coating material, and various interfaces. Surface contamination, poor adhesion, and a mismatch in thermal properties can further contribute to the creation of nonuniform temperature distributions that gradually lead to film degradation, including cracking, peeling, delamination, and surface breakdown.

One approach that has shown great promise for achieving the increasingly high-performance requirements of AR surfaces is the use of motheye, or subwavelength, structures. The surface of a moth's eye is covered by an array of conical protuberances 200 nm high separated by 200 nm. A motheye structure creates what is effectively a gradient-index film from a material of uniform refractive index. Bruce MacLeod at Holographic Lithography Systems, Inc. (Bedford, Mass.) used holographic lithography for fabricating motheye-type structures. A further discussion of holographic lithography to fabricate motheye-type structure is found in Mr. MacLeod's article "Thin Films—Motheye Surfaces Reflect Little Eye", published in *Laser Focus World*, August 1999, which is hereby incorporated by reference in its entirety. Holographic lithography is the process of recording, in a photosensitive film, a periodic pattern resulting from the interference of two coherent laser beams. The main difficulty with holographic exposure technique is to achieve structures with a high aspect ration homogeneously over the whole area.

G. Xie suggests another method of fabrication nanostructured anti-reflective layers: replication from natural biotemplate; his article "The fabrication of subwavelength anti-reflective nanotsructures using a bio-template" was published in Nanotechnology journal, v. 19 (2008). Specifically, the nano-nipple arrays on the surface of cicada wings have been precisely replicated to a PMMA (polymethyl methacrylate) film with high reproducibility by a technique of replica molding, which mainly involves two processes: one is that a negative Au mold is prepared directly from the bio-template of the cicada wing by thermal deposition; the other is that the Au mold is used to obtain the replica of the nanostructures on the original cicada wing by casting polymer. The reflectance spectra measurement shows that the replicated PMMA film can considerably reduce reflectivity at its surface over a large wavelength range from 250 to 800 nm, indicating that the anti-reflective property has also been inherited by the PMMA film.

A. Piehl, in U.S. Pat. No. 7,170,666 B2, tries to overcome optical lithography difficulties by fabrication nanostructured anti-reflective surfaces using self-assembly operation. He deposits thin gold layer and then upon heating to high temperatures converts this layer into plurality of nanostructures smaller than a wavelength of light.

Abovementioned methods of nanostructured anti-reflective layers fabrication are not manufacturable on industrial scale, scalable or production-worthy. Holographic lithography is too sensitive of a technique to be used for volume production. The biotemplate method is limited by specific specimen pattern. Both methods are limited by the processing area of the specimen.

Recently, Nanoimprint lithography method has been suggested, for example by Z. Yu for subwavelength (nanostructured) anti-reflective coatings fabrication in his article "Fabrication of large area subwavelength antireflection structures on Si using trilayer resist Nanoimprint lithography and lift-off", published in Journal of Vacuum Science and Technology, v. B21(6), 2003. Nanoimprint method is based on deformation of photoresist upon mechanical impact by the nanostructured mold. Two-dimensional ("2D") subwavelength broadband anti-reflection surfaces on silicon have been demonstrated using this technology with reflectivity of 0.3% at 632.8 nm wavelength.

Another example of nanostructured devices is based on plasmonic structures. The optical properties of metal nanoparticles, especially those of the noble metals Au, Ag, and Cu, show striking differences in their optical response relative to their bulk or thin-film counterparts. The ability of such structures to sustain coherent electron oscillations known as surface plasmons (SPs) leading to electromagnetic fields confined close to the metallic surface has been intensively investigated both in light of the fundamental physics involved and for applications such as surface-enhanced spectroscopy and enhancement of a wide range of nonlinear optical phenomena, sensing, light detection and generation.

Plasmonic effects have been explored and shown very promising results for enhancement of efficiency of light absorption in solar cells and light extraction of light emitting diodes. Most recently, studies have shown that spherical Au nanoparticles with diameters of 50-100 nm deposited on crystalline Si p-n junction photodiodes increase the absorption of light over a broad spectral range via the interaction of the incident electromagnetic radiation with SP modes in the nanoparticles that gives rise to electromagetic field enhancements in the active region of the photodiode, as was demonstrated by D. Schaadt in his article "Enhanced semiconductor optical absorption via surface plasmon excitation in metal nanoparticles," published in Appl. Phys. Lett. 86, 063106, 2005 Because the electromagnetic fields present in a semiconductor give rise to an optical transition rate proportional to the square of the electric field amplitude, the resulting increase in amplitude of the electromagnetic fields results in an increased photogeneration of electron-hole pairs, and consequently increased photocurrent current from the device. Although metallic nanostructures are preferred for this application because of their strong interact with light, our technique is also capable of generating semiconductor and insulating nanostructures. In addition to nanoparticles, nanowires and stripes can be generated by our proposed technique as well.

David A. Boyd, Mark L. Brongersma, and Leslie Greengard in US patent application 20050202185 have used the field enhancement to initiate and control photochemical reactions, including excited electron-hole pairs in a wide variety of materials systems. D. Derkacs in his paper "Improved performance of amorphous silicon solar cells via scattering from surface plasmon polaritons in nearby metallic nanoparticles", published in Applied Physics Letters journal, v, 89, 09310, have applied this concept to a-Si:H solar cells to achieve engineered enhancements in optical absorption, short-circuit current density, and energy conversion efficiency. At relatively modest nanoparticle densities, increases in short-circuit current density and energy conversion efficiency were obtained under halogen lamp illumination in excess of 8%, with finite-element electromagnetic simulations indicating that substantially larger increases should be possible at higher nanoparticle densities. The researchers also noted, that in order to increase the concentration of nanoparticles on the surface, the deposition procedure was repeated up to five times; additional iterations typically resulted in clustering of nanoparticles on the surface. Obviously, this nanoparticle deposition approach has limitations in the achievable density of particles, which in turn limits plasmonic efficiency enhancement.

S. Pillai in his paper "Surface plasmon enhanced silicon solar cells", published in Journal of Applied Physics, v. 101, 093105 (2007) reported a sevenfold enhancement for wafer-based cells at $\lambda=1200$ nm and up to 16-fold enhancement at $\lambda=1050$ nm for 1.25 µm thin silicon-on-insulator (SOI) cells using plasmonic effect based on metal nanoparticles. He also reported a close to 12-fold enhancement in the electroluminescence from ultrathin SOI light-emitting diodes and investigated the effect of varying the particle size on that enhancement. Metal nanoparticles were deposited by thermal evaporation of thin layers of silver followed by annealing. During annealing process the particles coalesce together to form islands due to surface tension.

S. Fujimori in his paper "Plasmonic light concentration in organic solar cells" accepted in NANOLETTERS, P. 1-17, reported on nanoparticle plasmonic enhancements for organic solar cells. He used an electrostatically-assisted aerosol deposition technique to deposit gold nanoparticles, which showed improvements in power conversion efficiency of up to 40%. Even further enhancements were expected by these authors for an increased coverage of well-dispersed Au nanoparticles. Unfortunately, increased coverage was not possible with the presented approach due to the high probability of nanoparticle clustering. Moreover, control of the metal nanostructure shape and organization of the metal nanoparticles, which is not possible with the employed technique, may lead to additional gains in efficiency.

Scott P. Price in his paper "Addressable, Large-Area Nanoscale Organic Light-Emitting Diodes" published in Small Journal, 2007, 3, No. 3, 372-374, has used soft nanolithography to produce patterns with feature sizes less than 500 nm using composite poly(dimethylsiloxane) (PDMS) stamps. He reported the fabrication of nano-OLED arrays over relatively large areas (about $cm^2$) and with higher pixel densities than those prepared using serial techniques. The method is very promising, but this implementation still limits processing area by actual size of the stamp, and does not allow high-throughput fabrication of large areas of optical materials.

Jing Zhao in his paper "Localized surface plasmon resonance biosensors", published in Nanomedicine 2006, 1(2), P. 219-228, have demonstrated that metallic nanoparticle arrays can serve as optical sensor platforms with submonolayer sensitivity for (bio)chemical molecules. The preferred way of making these structures over large areas is by nanosphere lithography. This process requires multiple consecutive deposition, washing, and etching steps and is not suitable for mass production.

Nanostructured surfaces have also been proved very useful in fabricating so called self-cleaning coatings. Peter Forbes in his article "Self-cleaning materials: Lotus-inspired nanotechnology", published in Scientific American, Jul. 30, 2008, explains principle of self-cleaning materials based on Lotus-Leaf effect: superhydrophobicity created by nature using nanopillar arrays and hydrophobic materials. Roach in his article "Progress in superhydrophobic surface development", published in Soft Matter, 2008, 4, P. 224-240 describes, for example, numerous methods of achieving self-cleaning effect based of superhydrophobic surfaces. Scaling up of these technologies for industrial applications are very problematic. Michael Berger in his article "Moth eyes self-cleaning anti-reflection nanotechnology coatings, published in Nanowerk, 2008 reports on Moth eye type coatings, which can combine anti-reflective and self-cleaning properties. Such coatings have been fabricated using colloids of silica particles deposition followed by reactive ion etch.

SUMMARY

Embodiments of the invention pertain to methods useful in the fabrication of nanostructured devices for optics, energy generation, displays, consumer electronics, life sciences and medicine, construction and decoration, by way of example and not by way of limitation. The methods of nanostructuring explained in this patent are especially useful for scaling up manufacturing to large surface areas, for example, architectural windows, solar cells, large flat panel displays, and other large-scale applications.

Instead of nanostructuring using colloids of particles, special vacuum deposition methods, laser interference systems (holography), and other low-throughput limited surface area techniques, we suggest to use nanotemplate created by patterning a photosensitive layer using novel nanolithography method, claimed earlier by authors—"Rolling mask" lithography. This method allows fast and inexpensive fabrication of nanostructures on large areas of substrate materials in conveyor-type continuous process.

Such nanotemplate is then used for selective deposition of functional materials. One of embodiments explains deposition of functional materials in the exposed and developed areas of the regular photoresist or self-assembled monolayer photoresist. Another embodiment uses selective deposition of the functional material on top of such self-assembled monolayer photoresist. And yet another embodiment uses sol-gel glass material as photoresist, which after development acts as a functional material.

Alternatively, nanotemplate is deposited and patterned on functional material, for example, on metal, glass or semiconductor layer, and then used as an etch mask to transfer nanostructure into the functional material using dry or wet etching process.

BRIEF DESCRIPTION OF THE DRAWINGS

So that the manner in which the exemplary embodiments of the present invention are attained is clear and can be understood in detail, with reference to the particular description provided above, and with reference to the detailed description of exemplary embodiments, applicants have provided illustrating drawings. It is to be appreciated that drawings are provided only when necessary to understand exemplary embodiments of the invention and that certain well known processes and apparatus are not illustrated herein in order not to obscure the inventive nature of the subject matter of the disclosure.

In FIG. 2, the substrate is a film 208 upon which a pattern is imaged by radiation which passes through surface relief 212 on a first (transparent) cylinder 206 while film 208 travels from roll 211 to roll 213. A second cylinder 215 is provided on the backside 209 of film 208 to control the contact between the film 208 and the first cylinder 206.

FIG. 3 shows a cross-sectional view of another embodiment of an apparatus 300 useful in patterning large areas of substrate material. In FIG. 3, the substrate is a film 308 which travels from roll 311 to roll 313. A first transparent cylinder 306 with surface relief 312 is used to pattern the topside 310 of film 308, while a second transparent cylinder 326 with surface relief 332 is used to pattern the bottom side 309 of film 308.

FIG. 4A shows a cross-sectional view of an embodiment 400 of a transparent cylinder 406 which includes a hollow center area 404 with an internal source of radiation 402. The surface relief area 412 is a conformal structure which includes polymer film 415 with a patterned surface 413 which is particularly useful for near-field lithography.

FIG. 4B shows an enlargement of surface 413, which is a surface relief polymer structure 413 on top of polymeric base material 415. In FIG. 4B, the polymer base material 415 may be either the same polymeric material or may be a different polymeric material from the patterned surface material 413.

FIG. 5A shows a cross sectional view of an alternative embodiment 500 of surface relief 512 which is present on a hollow transparent cylinder 506.

FIG. 5B shows an enlargement of the surface relief 512, which is a thin metal layer 514 which is patterned with a series of nanoholes 513, where the metal layer is applied over the exterior surface 511 of hollow transparent cylinder 506.

FIG. 5C shows an alternative surface relief 522 which may be used on the surface of transparent cylinder 506. Surface relief 522 is formed by metal particles 526 which may be applied directly upon the exterior surface 511 of hollow transparent cylinder 506 or may be applied on a transparent film 524 which is attached to the exterior surface 511 of hollow transparent cylinder 506.

DETAILED DESCRIPTION OF EXEMPLARY EMBODIMENTS

As a preface to the detailed description, it should be noted that, as used in this specification and the appended claims, the singular forms "a", "an", and "the" include plural referents, unless the context clearly dictates otherwise.

When the word "about" is used herein, this is intended to mean that the nominal value presented is precise within ±10%.

In order to manufacture nanostructured devices we employ a new concept of a "rolling mask" near-field lithography, which allows high-throughput nanopatterning over large areas of substrate materials. This nanolithography method is described in earlier patents of the authors, PCT/US2008/012901 filed Nov. 18, 2008 and U.S. Ser. No. 12/384,167 filed Apr. 1, 2009.

The nanopatterning technique makes use of Near-Field UV photolithography, where the mask used to pattern the substrate has shape of cylinder, cone or spheres, and is in contact or in very close proximity (in the evanescent field, less than 100 nm) from the substrate. The Near-Field photolithography may include a phase-shifting mask or surface plasmon technology.

Embodiments of the invention relate to methods and apparatus useful in the nanopatterning of large area substrates, where a rotatable mask is used to image a radiation-sensitive material. Typically the rotatable mask comprises a cylinder, cone or sphere. The nanopatterning technique makes use of near-field photolithography, where the wavelength of radiation used to image a radiation-sensitive layer on a substrate is 650 nm or less, and where the mask used to pattern the substrate is in contact with the substrate. The near-field photolithography may make use of a phase-shifting mask, or nanoparticles on the surface of a transparent rotating cylinder, or may employ surface plasmon technology, where a metal layer on the rotating cylinder surface comprises nano holes. The detailed description provided below is just a sampling of the possibilities which will be recognized by one skilled in the art upon reading the disclosure herein.

Figure 1A:
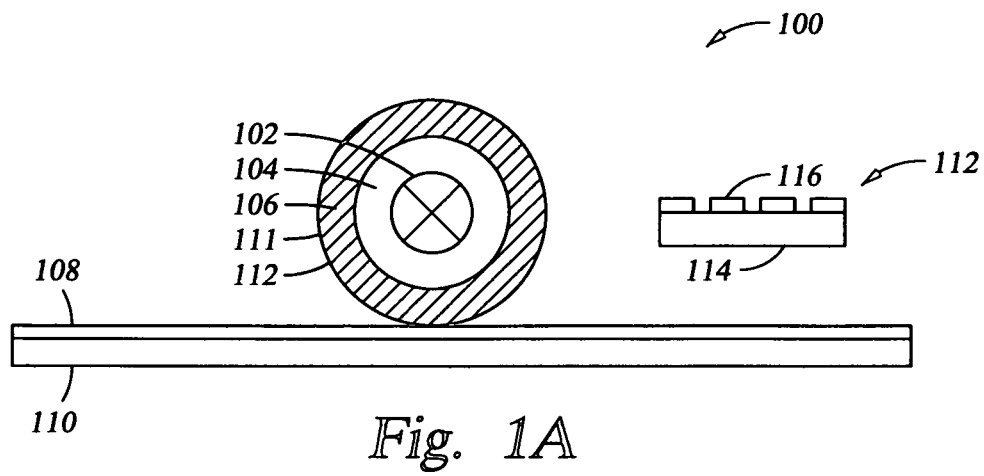
FIG. 1A shows a cross-sectional view of one embodiment of an apparatus 100 useful in patterning of large areas of substrate material, where a radiation transparent cylinder 106 has a hollow interior 104 in which a radiation source 102 resides. In this embodiment, the exterior surface 111 of the cylinder 106 is patterned with a specific surface relief 112. The cylinder 106 rolls over a radiation sensitive material 108 which overlies a substrate 110.
Figure 1B:
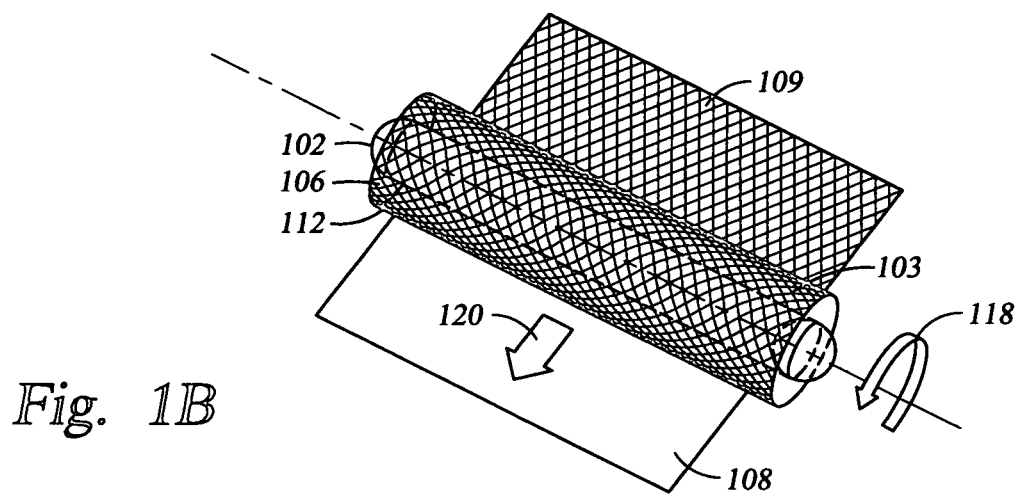
FIG. 1B shows a top view of the apparatus and substrate illustrated in FIG. 1A, where the radiation sensitive material 108 has been imaged 109 by radiation (not shown) passing through surface relief 112.

Although the rotating mask used to generate a nanopattern within a layer of radiation-sensitive material may be of any configuration which is beneficial, and a number of these are described below, a hollow cylinder is particularly advantageous in terms of imaged substrate manufacturability at minimal maintenance costs. FIG. 1A shows a cross-sectional view of one embodiment of an apparatus 100 useful in patterning of large areas of substrate material, where a radiation transparent cylinder 106 has a hollow interior 104 in which a radiation source 102 resides. In this embodiment, the exterior surface 111 of the cylinder 106 is patterned with a specific surface relief 112. The cylinder 106 rolls over a radiation sensitive material 108 which overlies a substrate 110. FIG. 1B shows a top view of the apparatus and substrate illustrated in FIG. 1A, where the radiation sensitive material 108 has been imaged 109 by radiation (not shown) passing through surface relief 112. The cylinder is rotating in the direction shown by arrow 118, and radiation from a radiation source 102 passes through the nanopattern 112 present on the exterior surface 103 of rotating cylinder 106 to image the radiation-sensitive layer (not shown) on substrate 108, providing an imaged pattern 109 within the radiation-sensitive layer. The radiation-sensitive layer is subsequently developed to provide a nanostructure on the surface of substrate 108. In FIG. 1B, the rotatable cylinder 106 and the substrate 120 are shown to be independently driven relative to each other. In another embodiment, the substrate 120 may be kept in dynamic contact with a rotatable cylinder 106 and moved in a direction toward or away from a contact surface of the rotatable cylinder 106 to provide motion to an otherwise static rotatable cylinder 106. In yet another embodiment, the rotatable cylinder 106 may be rotated on a substrate 120 while the substrate is static.

The specific surface relief 112 may be etched into the exterior surface of the transparent rotating cylinder 106. In the alternative, the specific surface relief 112 may be present on a film of polymeric material which is adhered to the exterior surface of rotating cylinder 106. The film of polymeric material may be produced by deposition of a polymeric material onto a mold (master). The master, created on a silicon substrate, for example, is typically generated using an e-beam direct writing of a pattern into a photoresist present on the silicon substrate. Subsequently the pattern is etched into the silicon substrate. The pattern on the silicon master mold is then replicated into the polymeric material deposited on the surface of the mold. The polymeric material is preferably a conformal material, which exhibits sufficient rigidity to wear well when used as a contact mask against a substrate, but which also can make excellent contact with the radiation-sensitive material on the substrate surface. One example of the conformal materials generally used as a transfer masking material is PDMS, which can be cast upon the master mold surface, cured with UV radiation, and peeled from the mold to produce excellent replication of the mold surface.

Figure 2:
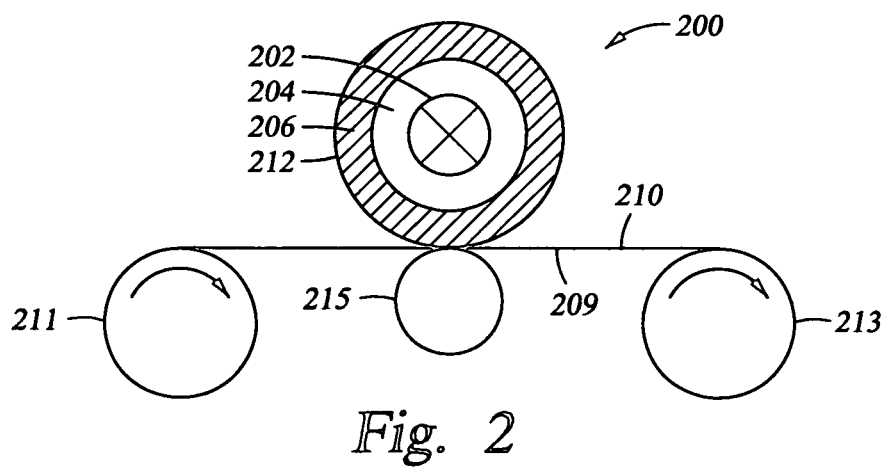
FIG. 2 shows a cross-sectional view of another embodiment of an apparatus 200 useful in patterning of large areas of substrate material.

FIG. 2 shows a cross-sectional view 200 of another embodiment of an apparatus 200 useful in patterning of large areas of substrate material. In FIG. 2, the substrate is a film 208 upon which a pattern is imaged by radiation which passes through surface relief 212 on a first (transparent) cylinder 206 while film 208 travels from roll 211 to roll 213. A second cylinder 215 is provided on the backside 209 of film 208 to control the contact between the film 208 and the first cylinder 206. The radiation source 202 which is present in the hollow space 204 within transparent cylinder 206 may be a mercury vapor lamp or another radiation source which provides a radiation wavelength of 365 nm or less. The surface relief 212 may be a phase-shift mask, for example, where the mask includes a diffracting surface having a plurality of indentations and protrusions, as discussed above in the Background Art. The protrusions are brought into contact with a surface of a positive photoresist (a radiation-sensitive material), and the surface is exposed to electromagnetic radiation through the phase mask. The phase shift due to radiation passing through indentations as opposed to the protrusions is essentially complete. Minima in intensity of electromagnetic radiation are thereby produced at boundaries between the indentations and protrusions. An elastomeric phase mask conforms well to the surface of the photoresist, and following development of the photoresist, features smaller than 100 nm can be obtained.

FIG. 3 shows a cross-sectional view 300 of another embodiment of an apparatus 300 useful in patterning large areas of substrate material. The substrate is a film 308 which travels from roll 311 to roll 313. There is a layer of radiation-sensitive material (not shown) on both the topside 310 of film 308 and the bottom side 309 of film 308. There is a first transparent cylinder 306, with a hollow center 304, which includes a radiation source 302, having surface relief 312, which is used to pattern the top side 310 of film 308. There is a second transparent cylinder 326, with a hollow center 324, which includes a radiation source 322, having surface relief 332, which is used to pattern the bottom side 209 of film 308.

FIG. 4A shows a cross-sectional view 400 of an embodiment of a transparent cylinder 406 which includes a hollow center area 404 with an internal source of radiation 402. The surface relief 412 is a conformal structure which includes polymer film 415 with a patterned surface 413 which is particularly useful for near-field lithography. The polymeric material of patterned surface 413 needs to be sufficiently rigid that the pattern will contact a substrate surface to be imaged in the proper location. At the same time, the polymeric material must conform to the surface of a radiation-sensitive material (not shown) which is to be imaged.

FIG. 4B shows an enlargement of surface 413, which is a surface relief polymer structure 413 on top of polymeric base material 415. In FIG. 4B, the polymer base material 415 may be either the same polymeric material or may be a different polymeric material from the patterned surface material 413. A transparent conformal material such as a silicone or PDMS, for example, may be used as polymer film 415, in combination with a more rigid transparent overlying layer of material, such as PDMS with a different ratio of mixing components, or polymethyl methacrylate PMMA, for example. This provides a patterned surface 413, which helps avoid distortion of features upon contact with a location on the radiation-sensitive surface of a substrate (not shown), while the polymeric base material simultaneously provides conformance with the substrate surface in general.

FIG. 5A shows a cross sectional view 500 of a transparent cylinder 506, with hollow central area 504 including a radiation source 502, where the surface 511 presents an alternative embodiment of surface relief 512. FIG. 5B shows an enlargement of the surface relief 512, which is a thin metal layer 514 which is patterned with a series of nanoholes 513, where the metal layer is present on the exterior surface 511 of hollow transparent cylinder 506. The metal layer may be a patterned layer adhered to the exterior surface of transparent cylinder 506. In the alternative, a metal layer may be deposited on the surface of the transparent cylinder by evaporation or sputtering or another technique known in the art and then may subsequently etched or ablated with a laser to provide a patterned metal exterior surface 511. FIG. 5C shows an alternative surface relief 522 which may be used on the surface of transparent cylinder 506. Surface relief 522 is formed by metal particles 526 which are applied on an exterior surface 511 of hollow transparent cylinder 506, or on a transparent film 524 which is attached to the exterior surface 511 of hollow transparent cylinder 506.

Figure 6A:
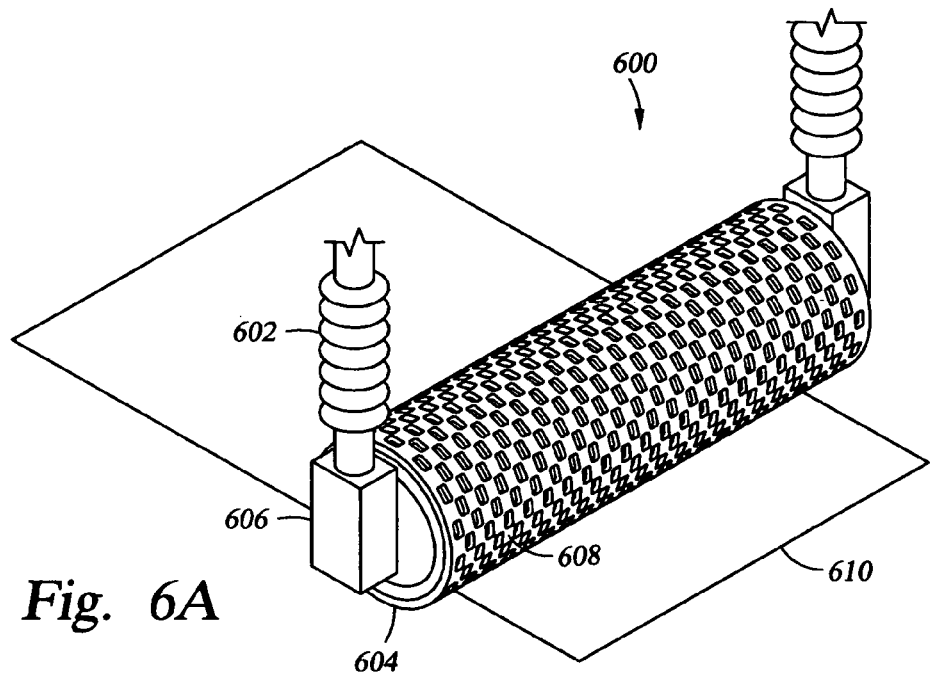
FIG. 6A is a schematic three dimensional illustration 600 of a transparent cylinder 604 having a patterned surface 608, where the cylinder 604 is suspended above a substrate 610 using a tensioning device 602 illustrated as springs.

FIG. 6A is a schematic three dimensional illustration 600 of a transparent cylinder 604 having a patterned surface 608. A radiation source (not shown) is present within the interior of transparent cylinder 604. The transparent cylinder 604 is suspended above a substrate 610 using a tensioning device 602, which is shown as springs in illustration 600. One of skill in the art of mechanical engineering will be familiar with a number of tensioning devices which may be used to obtain the proper amount of contact between the outer surface 608 of transparent cylinder 604 and the surface of substrate 610. In one embodiment method of using the apparatus shown in FIG. 6A, the apparatus is used to image a radiation-sensitive material (not shown) on a substrate 610, where substrate 610 is a polymeric film, which may be supplied and retrieved on a roll to roll system of the kind shown in FIG. 2. The transparent cylinder 604 is lowered toward the polymeric film substrate (or the polymeric film substrate is raised), until contact is made with the radiation-sensitive material. The polymeric film, which is typically elastomeric will create a Van-der-Walls force bond with the radiation-sensitive material. The transparent cylinder 604 may then be raised (or the polymeric film substrate lowered) to a position where contact remains between the surface 608 of transparent cylinder 604 and the surface of the radiation-sensitive material, but the tension between the two surfaces is such that the force placed on the surface 608 is minimal. This enables the use of very fine nanopatterned features on the surface 608 of transparent cylinder 604. When the substrate 610 begins to move, the transparent cylinder 604 will also move, forcing transparent cylinder 604 to rotate, maintaining the dynamic contact between the radiation-sensitive material and the underlying polymeric film substrate 610. At any moment of the dynamic exposure, the contact between the cylinder and a photosensitive layer is limited to one narrow line. Due to strong Van-der Walls forces between an elastomeric film, for example, on the cylinder exterior surface and the radiation sensitive (photo sensitive) layer on the substrate, contact is maintained uniform throughout the entire process, and along the entire width of the mask (length) on the cylinder surface. In instances where an elastomeric material is not present on the cylinder surface which contacts the substrate, an actuating (rotating) cylinder using a stepper-motor synchronized with the translational movement of the substrate may be used. This provides a slip-free exposure process for polymeric or other cylinder surface material which does not provide strong adhesion forces relative to the substrate.

Figure 6B:
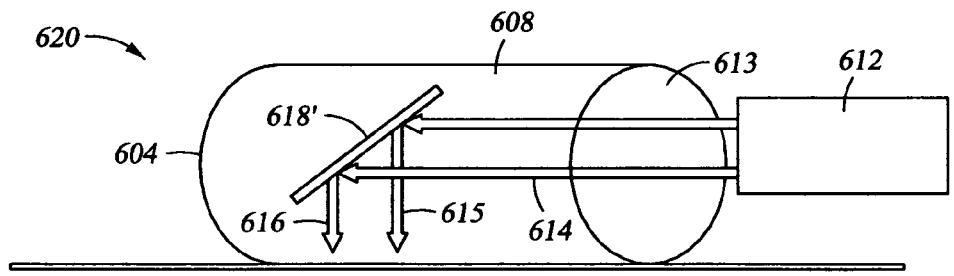
FIG. 6B is a schematic of an embodiment 620 where the radiation used to accomplish imaging is supplied from a radiation source 612 exterior to cylinder 604, with the radiation distributed internally 615 and 616 within the hollow portion of the cylinder 604.

FIG. 6B is a schematic of an embodiment 620 where the radiation used to accomplish imaging is supplied from a radiation source 612 exterior to cylinder 604, with the radiation distributed internally 615 and 616 within the hollow portion of the cylinder 604. The radiation may be directed through the transparent cylinder 604 through the patterned mask surface 608 toward the radiation-sensitive surface (not shown) of substrate 608 using various lenses, mirrors, and combinations thereof.

Figure 6C:
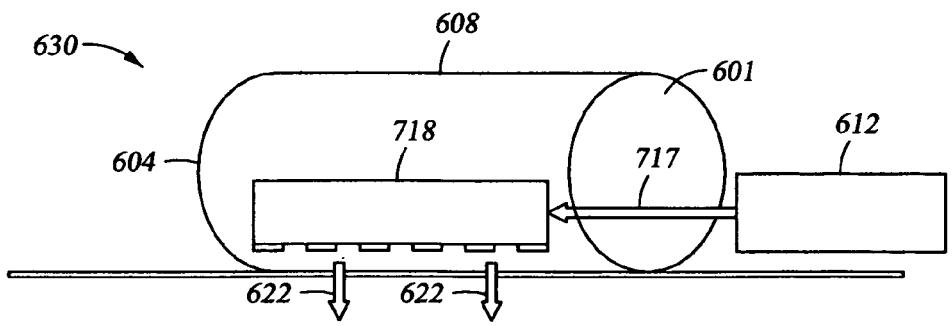
FIG. 6C is a schematic of an embodiment 630 where the radiation used to accomplish imaging is supplied from the exterior radiation source 612 is focused 617 into a waveguide 618 and distributed from the waveguide 618 to an optical grating 621 present on the interior surface 601 of the cylinder 604.

FIG. 6C is a schematic of an embodiment 630 where the radiation used to accomplish imaging of the radiation-sensitive material is supplied from a location which is exterior to the transparent cylinder 604. The exterior radiation source 612 is focused 617 into a waveguide 618 and distributed from the waveguide 618 to an optical grating 620 present on the interior surface 601 of the cylinder 604.

When photoresist is used as a photosensitive material, patterning process should be followed by development of exposed photoresist. In the case of using self-assembled monolayer as a photosensitive material, no development is necessary due to the in-situ removal of the UV-exposed self-assembled monolayer in air, oxygen or ozone environment.

Another embodiment includes using photosensitive sol-gel glass materials in this process. Such photosensitive material after development can act as a functional material for anti-reflective, anti-glare, self-cleaning, and many other applications.

Once the photosensitive layer is patterned one can use the formed pattern as a template to deposit additional materials or as an etch mask to transfer pattern into the underlayer. For example, one can fabricate metal-containing islands of any shape, size, orientation, spatial arrangement, and density on the surface using any known methods of metallization through the photoresist template formed using "rolling mask" near-files optical lithography. These arrays of nanometallic islands will form the various plasmonic structures. Deposition of metal materials can be implemented using PVD, CVD, ALD, MVD and other vacuum-based techniques.

Non-vacuum methods can also be used, like sol-gel, electroplating, electroless plating, etc. Deposition of materials through a template can be followed by lift-off of template materials (photoresists, etc.). Alternatively, template materials can be left in the structure.

One of the preferred embodiments is to deposit metal-containing materials on the substrate through a template from a liquid phase application using a roller, as per earlier patent application by the authors, U.S. Ser. No. 12/455,938. Metal-containing materials can be chosen to attach only to template materials or only to substrate material exposed through the template. The thickness of the metal islands can be controlled by optimization of process transfer speed, viscosity of precursor, number of contact cycles with the roller, and other processing parameters.

Figure 7:
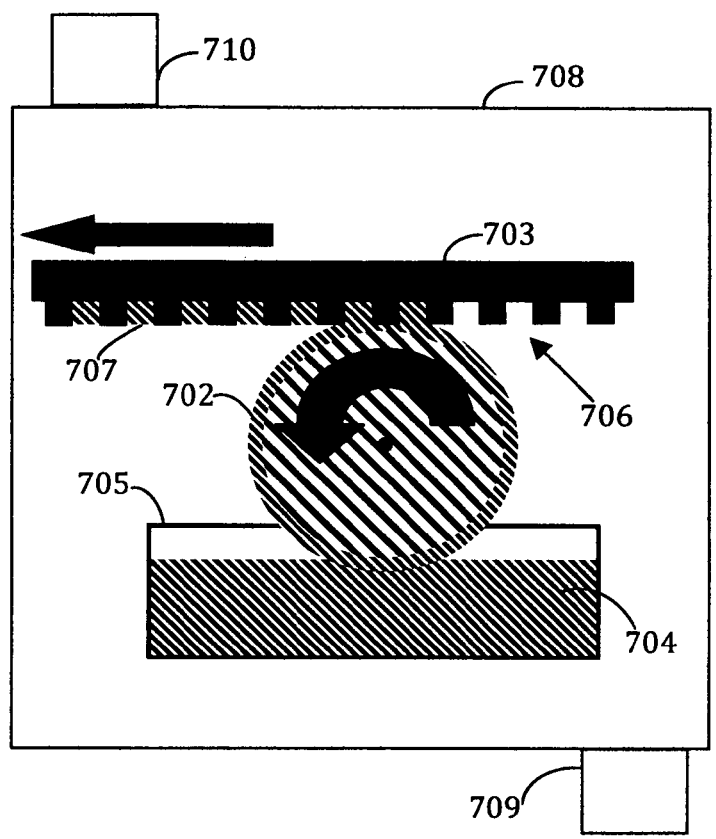
FIG. 7 is a schematic representation of the deposition apparatus where functional material 704 is deposited on the substrate 703 using cylindrical applicator 701 selectively in the exposed and developed areas 707 of the photoresist or self-assembled monolayer template 706.

We suggest materials application method by "rolling" applicator over surface of a template. Applicator has a shape of a cylinder or a cone. FIG. 7 represents a cross-section view of the applicator in the form of cylinder 701, laminated with soft polymer material 702, which is brought in contact with a substrate 703 on one side and with a liquid 704 stored in a bath 705, on the other side. The substrate 703 has a pre-fabricated template 706, patterned in accordance with specified mask pattern. When substrate is brought in contact with polymer film 702 and moved linearly, for example, right to left, it turns cylinder 701 counter clock-wise. Alternatively, cylinder 701 can be rotated separately in-synch with the sample movement. During such rotation liquid 704 is transferred from the bath 705 through the polymer film 702 and into the substrate's surface 707. This transfer is driven by capillary forces, which directs liquid from the applicator surface into the valleys (holes, tranches, etc.) of the template, where functional material is adsorbs or reacts with the surface.

Residue of functional material adsorbed on the template film 6 can be further removed along with the template itself during template removal by dissolving it in solvent solution, the process known as "lift-off".

Amount of material deposited onto the substrate can be controlled by many different factors, like viscosity of liquid, speed of applicator rotation, distance or pressure between applicator and a substrate, potentials (charge) on applicator and substrate surfaces, etc.

Deposition system can be set in an enclosure 708 having continuous supply of dry Nitrogen 709 and an exhaust 710 to remove environmental impact (mainly, moisture) on the deposition process and exhaust evaporated solvents and other materials.

A polymer film laminated on the cylindrical applicator can be made of soft material, capable of swelling by deposition materials; such soft material can for example be Polydimethylsiloxane (PDMS) film.

Alternatively, liquid can be supplied to the applicator in-situ by soaking/immersion of a polymer film in a bath or continuous dripping of liquid onto applicator's surface from a nozzles (not shown).

Another method of supplying functional material to the applicator's surface is vapour phase deposition.

Alternatively, multiple cylinders are used in sequence to increase the duration of substrate contact with the deposition material, which would enhance density of functional material deposited on the substrate.

When SAM material is used as a template material there are 2 options for selective deposition of functional materials:

The first method is to deposit functional material in the areas free from SAM (valleys), as it is demonstrated on FIG. 7, similar to deposition on regular polymer templated substrate. To do that SAM has to have terminal group which repels deposition material. In this case functional material will stay only in the areas free of SAM. Examples of such terminal groups can be any halogenated hydrocarbons, aliphatic or aromatic. Halogen can be fluorine, chlorine, bromine, iodine, etc. Some examples of useful precursors are: Octadecyltrichlorosilane (OTS), Octyltrichlorosilane (OTCS), Dodecyltrichlorosilane (DDTCS), dimethyldichlorosilane (DDMS), tridecafluoro-1,1,2,2-tetrahydrooctyltrichlorosilane (FOTS), heptadecafluoro-1,1,2,2-tetrahydrodecyltrichlorosilane (FDTS), (tridecafluoro-1,1,2,2,-tetrahydrooctyl)trisdimethylamino silane (PF8TAS), (heptadecafluoro-1,1,2,2,-tetrahydrodecyl)tris-dimethylamino silane (PF10TAS), octylsilane, n-dodecanethiolate, n-octadecanethiol, etc.

Figure 8:
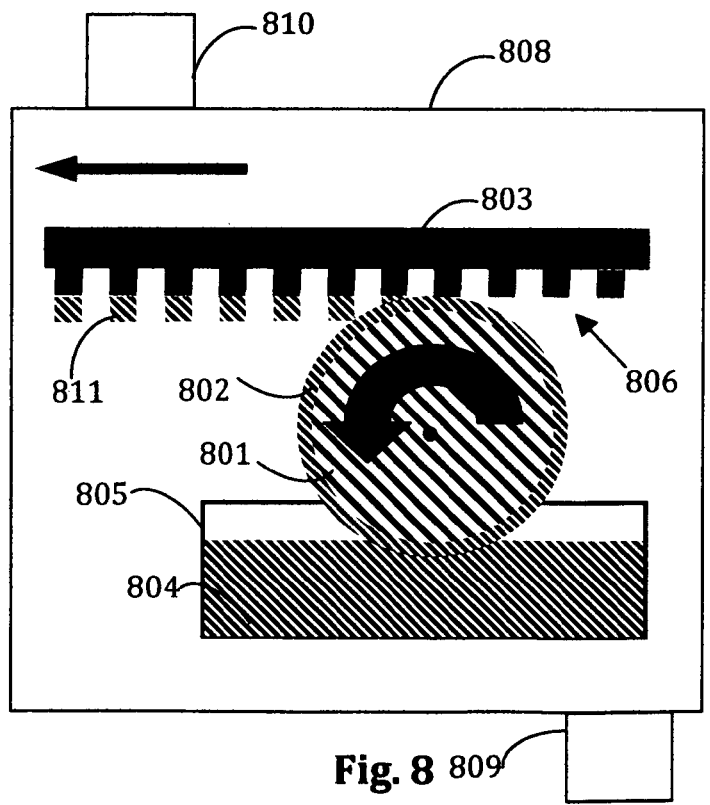
FIG. 8 is a schematic representation of the deposition apparatus where functional material 804 is deposited on the substrate 803 using cylindrical applicator 801 selectively onto the self-assembled monolayer template 806

The second method is to deposit functional material only on top of SAM template, and leave exposed substrate surface uncoated, as demonstrated on FIG. 8. In order to do that SAM should have terminal groups having good affinity to the functional material. There are plenty of known combinations of SAM's terminal groups with different materials, which one can use to engineer selective material deposition onto SAM template.

For example, noble metal, like Au, Ag, Pt, and also Cu, Ni, Zn, Ru, Zn, Ge can be attached to SAMs having mercapto, amino or cyano ligand as terminal group; Si, SiO2, TiO2, Fe2O3, other oxides can be attached successfully to SAMs having R-OH ligand. In this case, metals or other materials could be transferred in liquid (from a solution) or dry (as material, for example, sputtered on applicator's surface) forms.

Figure 9:
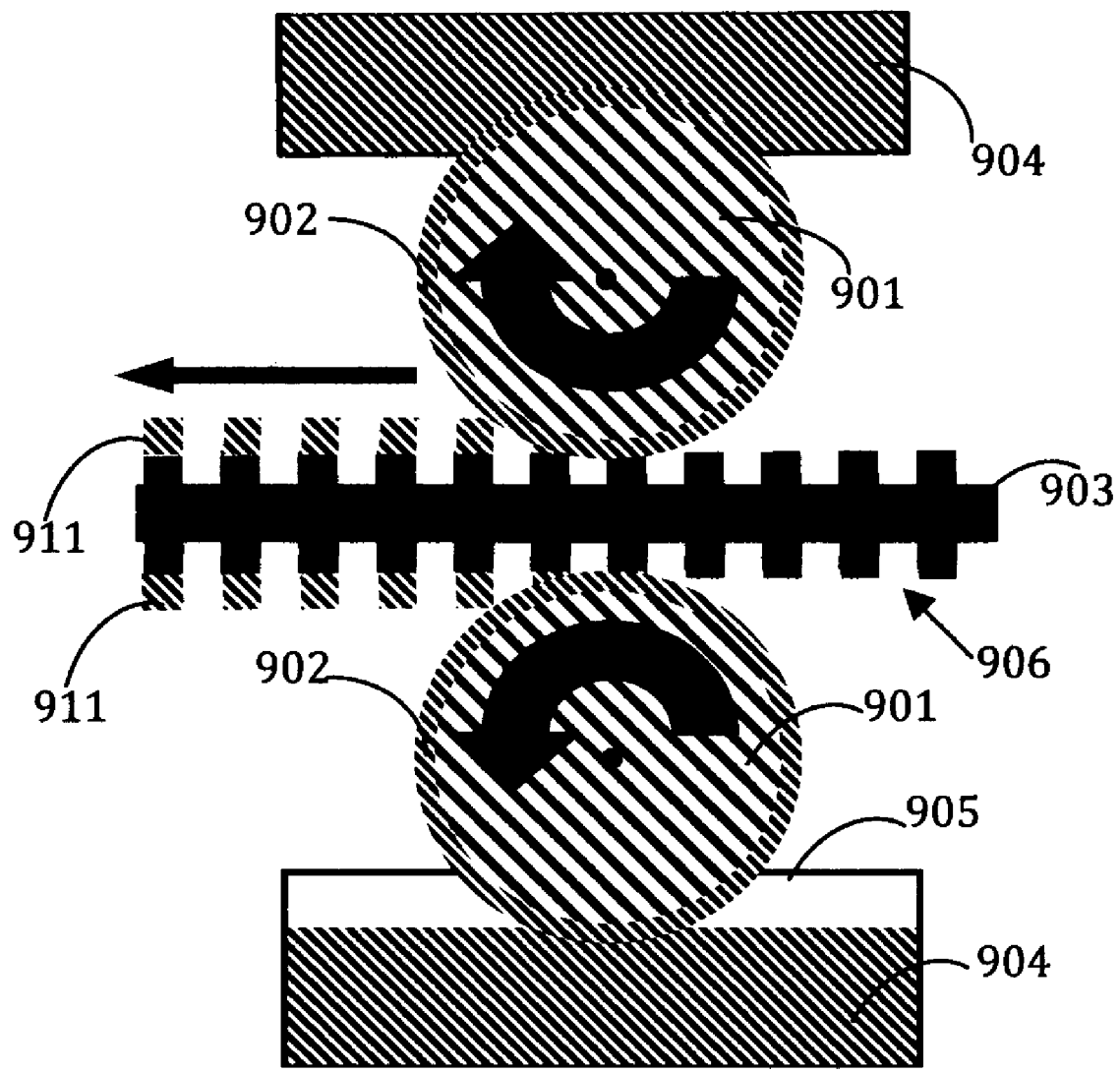
FIG. 9 is a schematic representation of the deposition apparatus where functional material 904 is deposited using 2 cylindrical applicators on the both sides of the substrate 903

FIG. 9 represents material deposition on both sides of the substrate 903 using two cylindrical applicators 901, one of which is rotating in clockwise direction; another in counter clock wise direction, and the substrate is moving right to left.

Substrate or film can be further flashed with water or solvents, like alcohols, to remove loosely bound access of material.

Substrate or film can be further heat treated by blowing hot inert gas (nitrogen) or by exposure to Infrared light using lamps, for example, to reduce metal-oxide to metal.

Subsequently, template material can be removed from the substrate by dissolving in a solvent or other means.

Functional materials, which can be deposited using suggested method can be metals, semiconductors, oxides, metal-oxides, hybrid organic-inorganic materials, polymers, oligomers, organic molecules, photoresists, magnetic materials, piezo materials, colloids of micro or nanoparticles.

The current patent removes numerous limitations of known methods for the fabrication of nanophotonic devices (including nanoparticles method, biomimetic templates method, self-assembly method, and nanoimprint lithography): limited particle density, non-uniformity, limited surface area, inability to control placement, shape, size and organization of nanostructures, low throughput and defectivity. The advantages of our method are higher density of nanopattern, tighter control over nano-islands shape, size and placement, which in turn manifests itself in higher efficiency of nanostructured devices, for example, high efficiency of solar cells and light emitting devices.

I claim:

1. A method for fabrication of nanostructured devices comprising of coating a surface of device with photosensitive material patterning photosensitive material using rolling mask lithography, which includes exposing photosensitive material with a light, generated by a light source, wherein such light is passed through a mask in the shape of cylinder, cone or sphere, and in addition, structured film is laminated on the outer surface of such mask; an exposure is performed in a dynamic regime while such mask is rolled over the substrate coated with a photosensitive material.

2. A method according to claim 1 wherein photosensitive material is photoresist, which is developed after the patterning.

3. A method according to claim 1 wherein photosensitive material is self-assembled monolayer.

4. A method according to claim 1 wherein photosensitive material is sol-gel material.

5. A method according to claim 2 wherein additional material is deposited over device's surface using patterned photoresist material as a template.

6. A method according to claim 3 wherein additional material is deposited over device's surface using patterned self-assembled monolayer as a template.

7. A method according to claim 2 wherein in addition a device's surface is etched using patterned photoresist as an etch mask.

8. A method according to claim 1 wherein a structured film is an elastomeric phase mask.

9. A method according to claim 1 wherein a structured film is a plasmonic layer.

10. A method according to claim 1 wherein the nanostructured device is a solar cell, flat panel display, fuel cells and other device, which includes nanostructured electrodes.

11. A method according to claim 1 wherein the nanostructured device is a light emitting diode, display, or other device, which includes a plasmonic light extraction layer.

12. A method according to claim 1 wherein the nanostructured device is a photonic crystal.

13. A method according to claim 1 wherein the nanostructured device is a quantum dot array.

14. A method according to claim 1 wherein the nanostructured device is a diffractive optical element or computer generated hologram.

15. A method according to claim 1 wherein the nanostructured device is a solar cell, image sensor, information display, architectural window or any other device or product, which has anti-reflective properties.

16. A method according to claim 1 wherein the nanostructured device is a solar cell, image sensor, information display, architectural window or any other device or product, which has anti-glare properties.

17. A method according to claim 1 wherein the nanostructured device a solar cell, image sensor, information display, architectural window, aircraft, wind turbine or any other device which has anti-icing properties.

18. A method according to claim 1 wherein the nanostructured device is a solar cell, image sensor, information display, architectural window, aircraft, wind turbine or any other device which has self-cleaning properties.

19. A method according to claim 1 wherein the nanostructured device has at least two enhanced properties simultaneously, for example, anti-reflective and self-cleaning, anti-glare and self-cleaning, or others.

* * * * *